United States Patent
Wang et al.

(10) Patent No.: US 12,310,192 B2
(45) Date of Patent: May 20, 2025

(54) LIGHT-EMISSION DRIVING SUBSTRATE, LIGHT-EMITTING PANEL, AND DISPLAY DEVICE

(71) Applicant: Shanghai Tianma Microelectronics Co., Ltd., Shanghai (CN)

(72) Inventors: Lihua Wang, Shanghai (CN); Yuheng Zhang, Shanghai (CN); Pengfei Qiu, Shanghai (CN); Shengchao Ji, Shanghai (CN)

(73) Assignee: Shanghai Tianma Microelectronics Co., Ltd., Shanghai (CN)

( * ) Notice: Subject to any disclaimer, the term of this patent is extended or adjusted under 35 U.S.C. 154(b) by 531 days.

(21) Appl. No.: 17/720,337

(22) Filed: Apr. 14, 2022

(65) Prior Publication Data

US 2023/0269975 A1    Aug. 24, 2023

(30) Foreign Application Priority Data

Feb. 22, 2022  (CN) .......................... 202210159355.X

(51) Int. Cl.
*H10K 59/131*    (2023.01)
(52) U.S. Cl.
CPC .................................. *H10K 59/131* (2023.02)
(58) Field of Classification Search
None
See application file for complete search history.

(56) References Cited

U.S. PATENT DOCUMENTS

2017/0127512 A1 *  5/2017  Park ...................... H01L 25/167
2020/0411778 A1   12/2020  Song et al.

FOREIGN PATENT DOCUMENTS

| CN | 103376947 A | 10/2013 |
|---|---|---|
| CN | 109803486 A | 5/2019 |
| CN | 110133924 A | 8/2019 |
| CN | 110189675 A | 8/2019 |
| CN | 110888275 A | 3/2020 |
| CN | 110972495 A | 4/2020 |
| CN | 111025793 A | 4/2020 |
| CN | 111916019 A | 11/2020 |
| CN | 112310165 A | 2/2021 |
| CN | 112327548 A | 2/2021 |
| JP | 2012089654 A | 5/2012 |

OTHER PUBLICATIONS

The First Office Action for Chinese Application No. 202210159355. X, dated Apr. 7, 2022, 8 pages.

\* cited by examiner

*Primary Examiner* — Kyoung Lee
(74) *Attorney, Agent, or Firm* — East IP P.C.

(57) ABSTRACT

A light-emission driving substrate includes: a substrate; a device layer disposed on the substrate, wherein the device layer comprises a plurality of first signal lines and second signal lines that are disposed in a light-emitting area, and includes a plurality of first connection terminals and second connection terminals that are disposed in a non-light-emitting area, each of the first connection terminals is electrically connected to an anode of the light-emitting element through the first signal line, and each of the second connection terminals is electrically connected to the cathode of a light-emitting element through the second signal line; and wherein a distance between at least one of the first connection terminals and the binding area is smaller than a distance between each of the second connection terminals and the binding area.

20 Claims, 10 Drawing Sheets

LIGHT-EMISSION DRIVING SUBSTRATE, LIGHT-EMITTING PANEL, AND DISPLAY DEVICE

CROSS-REFERENCE TO RELATED APPLICATION

The present application claims priority to Chinese Patent Application No. 202210159355.X, filed on Feb. 22, 2022, which is incorporated herein by reference in its entirety.

TECHNICAL FIELD

The present application relates to the field of display technology, and in particular to a light-emission driving substrate, a light-emitting panel and a display device.

BACKGROUND

A Light-emitting element such as an organic light-emitting diode (Organic Light Emitting Diode, OLED), a mini light-emitting diode (a mini LED) and a micro light-emitting diode (a micro LED) is widely used in fields of illumination and display technologies.

In order to better drive a light-emitting element to emit light so as to realize illumination or display, it is necessary to provide a light-emission driving substrate for controlling the light-emitting element. A traditional light-emission driving substrate, when controlling the light-emitting element to emit light, causes that brightness of an area surrounding a driving chip on the driving substrate is darker than that of remaining areas on the driving substrate due to defects in its structural design, which affects uniformity of light-emitting surfaces.

SUMMARY

The embodiments of the present application provide a light emission driving substrate, a light emitting panel and a display device. In a first aspect, according to the embodiments of the present application, there is provided a light-emission driving substrate for driving light-emitting elements. The driving substrate includes a light-emitting area and a non-light-emitting area that is disposed around at least a part of the light-emitting area, and the non-light-emitting area includes a binding area for binding a driving chip, and the light-emission driving substrate includes: a substrate; and a device layer disposed on the substrate, wherein the device layer includes a plurality of first signal lines and second signal lines that are disposed in the light-emitting area, and includes a plurality of first connection terminals and second connection terminals that are disposed in the non-light-emitting area, each of the first connection terminals is electrically connected to an anode of the light-emitting element through the first signal line, and each of the second connection terminals is electrically connected to a cathode of the light-emitting element through the second signal line; and wherein a distance between at least one of the first connection terminals and the binding area is smaller than a distance between each of the second connection terminals and the binding area.

In another aspect, according to the embodiments of the present application, there is provided a light-emitting panel, including: the light-emission driving substrate as described above; and a light-emitting layer stacked on a side of the device layer away from the substrate and disposed in the light-emitting area, wherein the light-emitting layer includes light-emitting elements that are disposed in an array, an anode of a light-emitting element is electrically connected to a first signal line and a cathode of a light-emitting element is electrically connected to a second signal line.

In another aspect, according to the embodiments of the present application, there is provided a display device, including the light-emitting panel as discussed above; and the driving chip connected to the binding area.

BRIEF DESCRIPTION OF THE DRAWINGS

The features, advantages and technical effects of the exemplary embodiments of the present application will be described below with reference to the accompanying drawings.

Figure 1:
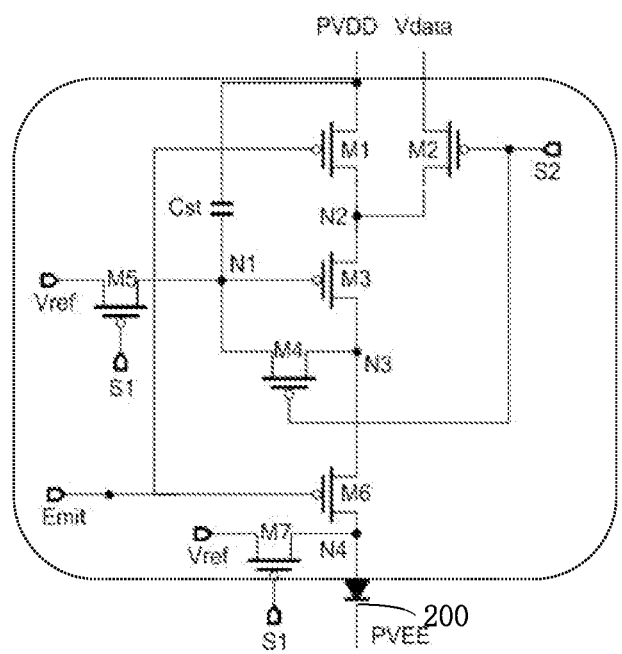
FIG. 1 is a schematic circuit diagram of a traditional light-emission driving substrate connecting with a light-emitting element.

In the figures:
100—light-emission driving substrate;
AA1—light-emitting area; AA2—non-light-emitting area; AA3—binding area;
10—substrate; 10a—pixel driving circuit;

20—device layer; 21—first signal line; 22—second signal line; 23—first connection terminal; 24—second connection terminal; 25—first transition line; 26—second transition line; 261—first segment; 262—second segment; 263—third segment; 27—bridging line; 271—via;

201—metal layer; 201a—first metal layer; 201b—second metal layer; 201c—third metal layer; 202—insulation layer;

200—light-emitting element; 210—anode; 220—cathode;

300—driving chip; 400—binding terminal; 500—pad; 600—data line; and

X—first direction; Y—thickness direction.

In the drawings, the same components are given the same reference numerals. The drawings are not drawn to actual scale.

DETAILED DESCRIPTION

Features and exemplary embodiments of various aspects of the present application will be described in detail below. In the following detailed description, numerous specific details are set forth in order to provide a thorough understanding of the present application. However, it will be apparent to those skilled in the art that the present application may be practiced without some of these specific details. The following description of the embodiments is merely to provide a better understanding of the present application by illustrating examples of the present application. In the drawings and the following description, at least some well-known structures and techniques are not shown in order to avoid unnecessarily obscuring the present application; and, dimensions of some structures may be exaggerated for clarity. Furthermore, the features, structures or characteristics described below may be combined in any suitable manner in one or more embodiments.

The directional terms appearing in the following description indicate directions shown in the drawings, and do not limit specific structures of the light-emission driving substrate, the light-emitting panel, the display device and the method therefor of the present application. In the description of the present application, it should also be noted that, unless otherwise expressly specified and limited, the terms "installation" and "connection" should be understood in a broad sense, for example, it may be a fixed connection or a detachable connection, or an integral connection; either directly or indirectly. For those skilled in the art, specific meanings of the above terms in the present application can be understood depending on specific circumstances.

A display device generally includes a light-emitting panel and a driving chip. The light-emitting panel includes a light-emission driving substrate and a light-emitting layer stacked on the light-emission driving substrate, wherein the light-emission driving substrate includes a plurality of pixel driving circuits and the light-emitting layer includes light-emitting elements that are arranged in an array. The pixel driving circuits are connected with the light-emitting elements to drive the light-emitting elements to emit light. The driving chip is bound on the light-emission driving substrate to provide control signals to the pixel driving circuits of the light-emission driving substrate. Correspondingly, it is necessary to set a binding area on the light-emission driving substrate for binding the driving chip, so as to realize controls of the light-emitting elements. The binding area may include binding terminals for being connected to data lines and the driving chip is connected to the data lines through the binding terminals so as to transmit data signals to the light-emitting elements.

A traditional light-emission driving substrate, when controlling light-emitting elements to emit light, causes that brightness of areas corresponding to the light-emitting area and the binding area is darker than that of remaining areas due to defects in its wirings, especially defects in an arrangement of connection terminals for lines that respectively have a great effect on light-emission uniformity such as a line connecting with an anode of a light-emitting element and a line connecting with a cathode of a light-emitting element, which affects uniformity of light-emitting surfaces.

Referring to FIG. 1, the applicant has further researched and found that in an example where a line for connecting with an anode of a light-emitting element 200 is a PVDD line that is provided for transmitting a positive voltage signal, and a line connecting with a cathode of the light-emitting element 200 is a PVEE line that is provided for transmitting a negative voltage signal, the PVDD line is connected to a PVDD connection terminal and the PVEE line is connected to a PVEE connection terminal. A light-emitting element 200 is disposed on a path that is formed by connecting the PVDD connection terminal and the PVEE connection terminal, and a driving transistor is also disposed on the path, wherein a switching transistor Ml is disposed between the driving transistor M3 and the PVDD connection terminal and a switching transistor M6 is disposed between the driving transistor M3 and the light-emitting element 200, and brightness of the light-emitting element 200 is determined by a voltage difference between a gate of the driving transistor M3 and a source of the driving transistor M3, which directly controls current flowing in the driving transistor M3, that is, current flowing through the light-emitting element 200, thereby affecting the brightness of the light-emitting element 200.

A voltage at the gate of the driving transistor M3 is inputted from a data line Vdata, and a voltage at the source of the driving transistor M3 is a voltage at the PVDD connection terminal, which is a constant voltage, and the nearer to an input terminal from a power supply the PVDD connection terminal is, the closer to an initial voltage inputted to the PVDD connection terminal the voltage is. During transmission of a voltage signal from the PVDD connection terminal to the light-emitting area, the farther away from the connection terminal the voltage signal is transmitted, the greater a loss is, and the loss reaches maximum when the voltage signal arrives at the farthest end, which will affect the voltage difference between the gate and the source of the driving transistor M3. The driving transistor M3 is very sensitive to a change in the voltage difference, so the change in the voltage difference will cause current flowing through the light-emitting element 200 to fluctuate greatly, thereby affecting the brightness of the light-emitting element 200. The PVEE connection terminal is connected to the cathode of the light-emitting element 200 through wires and the driving transistor M3 is in a saturation state during operation, so a change in voltage of the PVEE connection terminal has a smaller effect on the current, and thus has a smaller effect on the brightness of the light-emitting element 200.

In the traditional light-emitting driving substrate, both the PVDD connection terminal and the PVEE connection terminal, upon being arranged, correspond to the binding area for the driving chip. Due to defects in such arrangement that the PVEE connection terminals are disposed in an area where the PVDD connection terminals are located, a transmission path of a voltage signal inputted from a PVDD connection terminal is increased, and thus there will be a great loss in the voltage signal during transmission, thereby affecting the brightness of the light-emitting element 200 and introducing a defect that light-emitting surfaces have poor uniformity.

To solve the above-discussed technical problem, the embodiments of the present application provide a driving substrate, a light-emitting panel and a display device, which will be described in detail below with reference to FIGS. 2 to 18.

Figure 2:
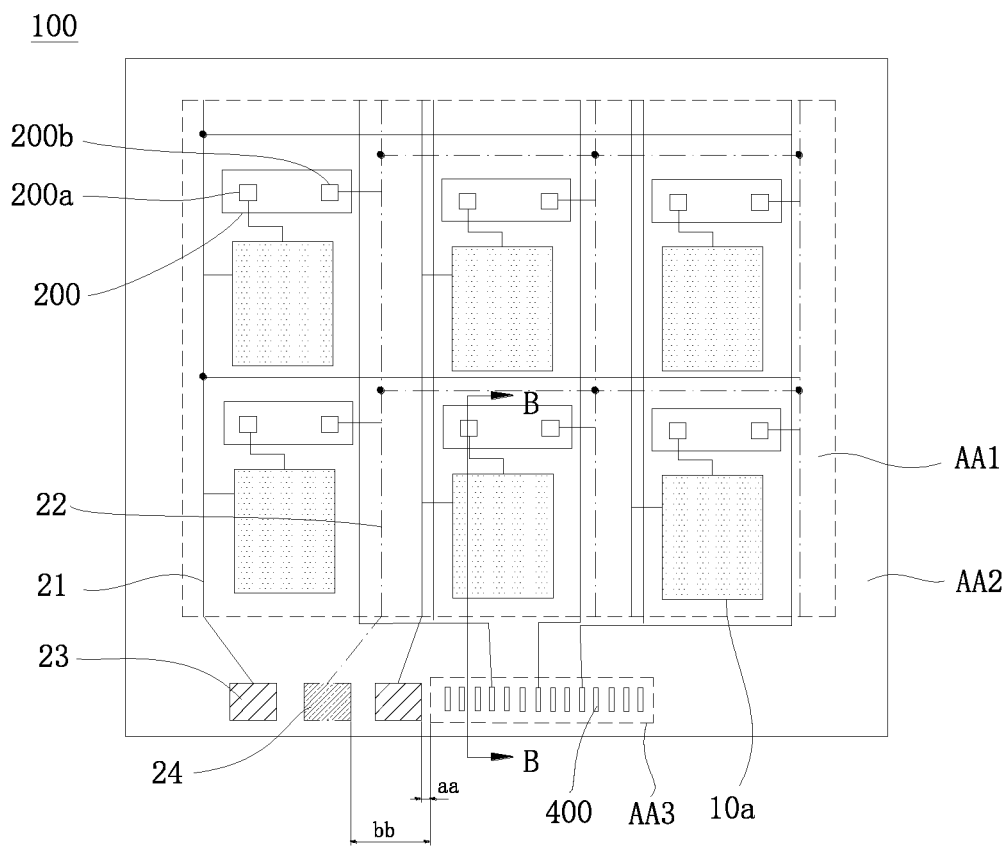
FIG. 2 is a schematic top view of a light-emission driving substrate according to an embodiment of the present application.
Figure 3:
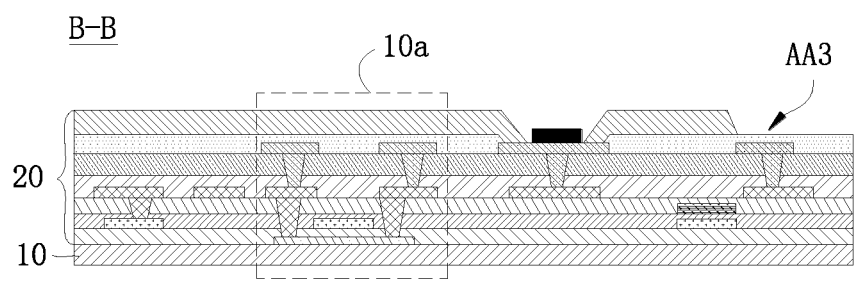
FIG. 3 is a sectional view along a B-B direction in FIG. 2.

Referring to FIGS. 2 and 3, the embodiments of the present application provide a light-emission driving substrate 100 for driving light-emitting elements 200. The light-emission driving substrate 100 includes a light-emitting area AA1 and a non-light-emitting area AA2 that is disposed around at least a part of the light-emitting area AA1, and the light-emitting area AA2 includes a binding area AA3 for binding a driving chip.

The light-emission driving substrate 100 includes a substrate 10 and a device layer 20 disposed on the substrate 10, the device layer 20 includes a plurality of first signal lines 21 and second signal lines 22 that are disposed in the light-emitting area AA1, and includes a plurality of first connection terminals 23 and second connection terminals 24 that are disposed in the non-light-emitting area AA2, each of the first connection terminals 23 is electrically connected to an anode 200*a* of a light-emitting element 200 via one of the first signal lines 21, and each of the second connection terminals 24 is electrically connected to a cathode 200*b* of a light-emitting element 200 via one of the second signal lines 22, and wherein a distance aa between at least one of the first connection terminals 23 and the binding area AA3 is smaller than a distance bb between each of the second connection terminals 24 and the binding area AA3.

In some embodiments, the light-emitting element 200 driven by the light-emission driving substrate 100 may be at least one of an organic light-emitting diode (Organic Light Emitting Diode, OLED), a mini light-emitting diode (mini LED), and a micro light-emitting diode (micro LED).

In some embodiments, the non-light-emitting area AA2 may completely surround the light-emitting area AA1. Certainly, in some examples, the light-emitting area AA1 may be partially surrounded by the non-light-emitting area AA2.

In some embodiments, the binding area AA3 is a partial area of the non-light-emitting area AA2, and the binding area AA3 is provided for binding the driving chip and has a shape matching with a geometric shape of the driving chip. For example, in a case where the driving chip to be bound is in a shape of rectangle, the binding area AA3 may have a shape of rectangle.

In some embodiments, the binding area AA3 includes binding terminals 400, and the binding area AA3 is bound to and electrically connected to the driving chip through the binding terminals 400.

In some embodiments, the substrate 10 may be flexible or rigid. In some embodiments, the substrate 10 may have a length direction, a width direction and a thickness direction, and the device layer 20 is disposed at a side of the substrate 10 in the thickness direction Y.

In some embodiments, the device layer 20 may include a plurality of pixel driving circuits 10*a*, wherein the plurality of pixel driving circuits 10*a* are arranged in an array in a display area, and a first signal line 21 may be electrically connected to an anode 200*a* of a light-emitting element 200 through a pixel driving circuit 10*a*. A second signal line 22 may be directly electrically connected to a cathode 200*b* of a light-emitting element 200. In some embodiments, the pixel driving circuit 10*a* may adopt a form of circuit shown as 7T1C in FIG. 1, and certainly, may adopt any other form of driving circuit, as long as requirements for connecting with and driving the light-emitting elements 200 can be satisfied.

In some embodiments, the number of the first connection terminals 23 and the number of the second connection terminals 24 may be the same or may be different, and the first connection terminals 23 and the second connection terminals 24 may be arranged as a whole in one row and one column, and certainly, may be disposed in two rows and two columns, and may be disposed in multiple rows or multiple columns.

In some embodiments, the first connection terminals 23 and the second connection terminals 24 may be alternately arranged, or at least two second connection terminals 24 may be disposed between two adjacent first connection terminals 23, or at least two first connection terminals 23 may be disposed between two adjacent second connection terminals 24.

In some embodiments, each of the first connection terminals 23 may be connected to one of the first signal lines 21 in a one-to-one correspondence. Certainly, each of the first connection terminals 23 may be connected to two or more of the first signal lines 21. In some embodiments, each of the second connection terminals 24 may be connected to one of the second signal lines 22 in a one-to-one correspondence. Certainly, each of the second connection terminals 24 may be connected to two or more of the second signal lines 22.

The distance between a first connection terminal 23 and the binding area AA3 refers to a length dimension of a minimum interval between a side of the first connection terminal 23 facing toward the binding area AA3 and an outer side of the binding area AA3; that is, the first connection terminal 23 has a first side that is close to the binding area AA3 and the binding area AA3 has a second side that is close to the first connection terminal 23 and the distance refers to a length dimension of a minimum interval between the first side and the second side. For example, the distance is that as indicated by the notation aa in FIG. 2.

The distance between a second connection terminal 24 and the binding area AA3 refers to a length dimension of a minimum interval between a side of the second connection terminal 24 facing toward the binding area AA3 and an outer side of the binding area AA3; that is, the second connection terminal 24 has a first side that is close to the binding area AA3 and the binding area AA3 has a second side that is close to the second connection terminal 24 and the distance refers to a length dimension of a minimum interval between the first side and the second side. For example, the distance is that as indicated by the notation bb in FIG. 2.

The distance aa between at least one of the first connection terminals 23 and the binding area AA3 is smaller than the distance bb between each of the second connection terminals 24 and the binding area AA3, that is, at least one of the first connection terminals 23 is located closer to the binding area AA3 than each of the second connection terminals 24. Particularly, it may be that the minimum distance aa between at least one of the first connection terminals 23 and the binding area AA3 is smaller than the minimum distance bb between each of the second connection terminals 24 and the binding area AA3.

In the light-emission driving substrate 100 according to the embodiments of the present application, the binding area AA3 is provided for placing a driving chip 300 and thus cannot be provided with connection terminals, so first signal lines 21 and second signal lines 22 that are disposed over the binding area AA3 in a direction parallel to the light-emitting panel 100 have to extend to the non-light-emitting area AA2 and bridge the binding area AA3 obliquely so as to be electrically connected to corresponding first connection terminals 23 and second connection terminals 24. As described above, brightness of a light-emitting element 200 is critically determined by a voltage difference between a gate and a source of a driving transistor in the pixel driving circuit 10a, which in turn is determined by a voltage drop of a voltage signal transmitted in a first signal line 21 electrically connecting with an anode 200a of the light-emitting element 200. Since the signal line is made of metal, during transmission of the voltage signal, the longer the line, the greater the loss. Fluctuation in voltage of the first signal line 21 connecting with the anode 200a has a greater effect on an output current of the driving transistor in the device layer 20 than fluctuation in voltage of the second signal line 22 connecting with the cathode 200b. Therefore, by setting that the distance aa between at least one of the first connection terminals 23 and the binding area AA3 is smaller than the distance bb between each of the second connection terminals 24 and the binding area AA3, the length of an extension part of a first signal line 21 that is used for bridging the binding area AA3 so as to electrically connect to a first connection terminal 23 can be reduced, and thus a transmission distance of a voltage signal inputted from the first connection terminal 23 can be reduced, and thereby a voltage drop of the first signal line 21 when bridging the binding area AA3 can be reduced and thus an effect on an output current of the driving transistor in the pixel driving circuit 10a can be reduced, which ensures uniformity of light-emitting surfaces while satisfying requirements for driving the light-emitting elements 200.

Figure 4:
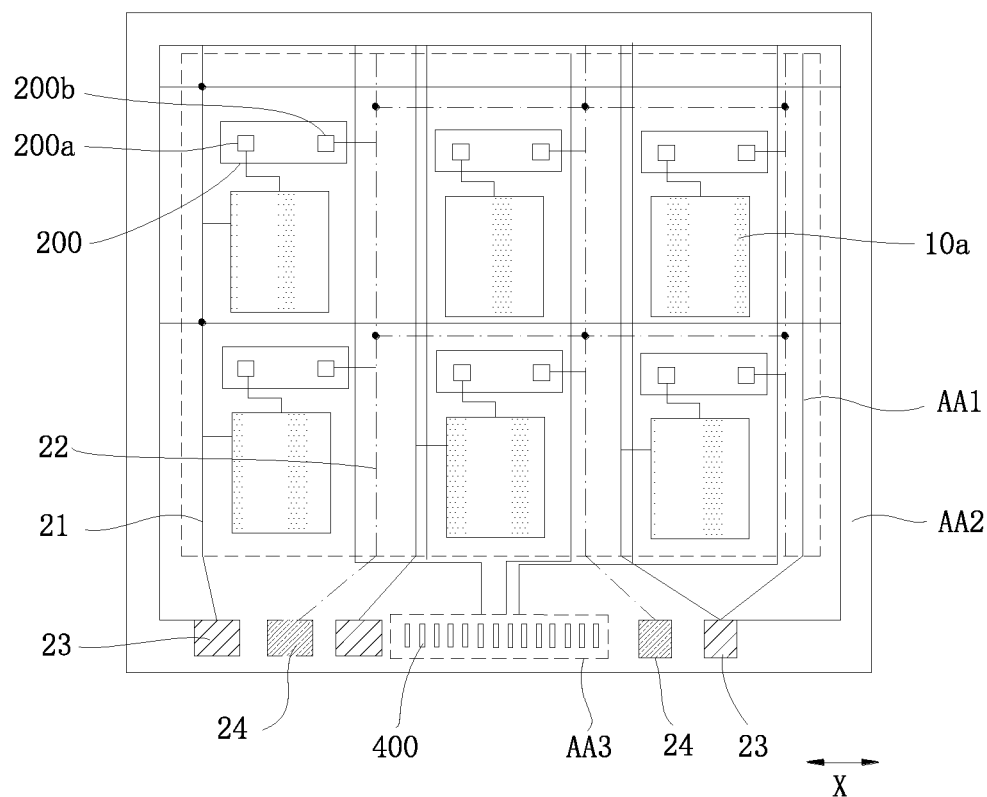
FIG. 4 is a schematic top view of a light-emission driving substrate according to another embodiment of the present application.

Referring to FIG. 4, in some embodiments, in the driving substrate according to the embodiments of the present application, the binding area AA3 includes two sides that are opposite with each other in the first direction X, and a first connection terminal 23 is disposed at each of the sides of the binding area AA3 in the first direction X. Since the binding area AA3 is generally disposed in a middle position of the light-emission driving substrate 100 in the first direction X or close to the middle position, there is a first signal line 21 at each of the sides of the bonding area in the first direction X. By providing a first connection terminal 23 at each of the sides of the binding area AA3 in the first direction X, the first signal line 21 at each of the sides of the binding area AA3 in the first direction X can be advantageously connected to the first connection terminal 23 at the same side, which reduces the length of the extension part of the first signal line 21 that is provided for bringing the binding area AA3 so as to electrically connect to the first connection terminal 23, and thus a voltage drop of the voltage signal inputted from the first connection terminal 23 during transmission can be reduced so that brightness of the light-emitting elements 200 in the light-emitting area AA1 tends to be consistent, thereby ensuring ensures uniformity of light-emitting surfaces.

It should be noted that, in the light-emission driving substrate 100 according to the embodiments of the present application either described above or below, the first connection terminals 23 at respective sides of the binding area AA3 may have same shape or dimension, or may have different shapes or dimensions. Similarly, the second connection terminals 24 at respective sides of the binding area AA3 may have same shape or dimension, or may have different shapes or dimensions. The figures are merely schematic, and the embodiments of the present application are not limited to the form of structures in shape and dimension shown in the figures.

Figure 5:
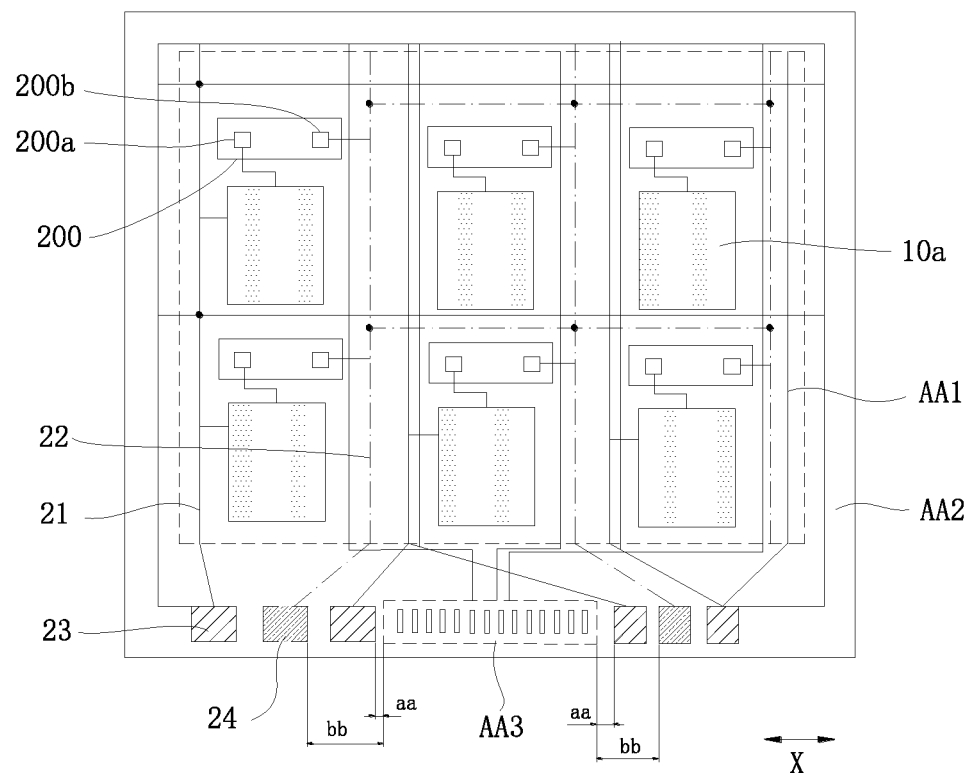
FIG. 5 is a schematic top view of a light-emission driving substrate according to still another embodiment of the present application.

Referring to FIG. 5, in some embodiments, for each of the sides of the binding area AA3 in the first direction X, a distance aa between at least one first connection terminal 23 and the binding area AA3 is smaller than a distance bb between each second connection terminal 24 and the binding area AA3. With such settings, for each of the sides of the binding area AA3 in the first direction X, the distance between at least one first connection terminal 23 and the binding area AA3 is smaller than the distance between each second connection terminal 24 at the same side and the binding area AA3. In the case where there is a first signal lines 21 at each of the sides of the binding area in the first direction X, the length of an extension part of a first signal line 21 that is provided for bridging the binding area AA3 so as to electrically connect to a first connection terminal 23 at each of the sides of the binding area AA3 can be reduced, and thus a transmission distance of a voltage signal inputted from the first connection terminal 23 can be reduced, and thereby an effect on an output current of respective driving transistor disposed at different sides of the binding area in the pixel driving circuit 10a can be reduced, which further ensures uniformity of light-emitting surfaces.

In the light-emission driving substrate 100 according to the embodiments of the present application, the plurality of first connection terminals 23 may be disposed at different positions in the non-light-emitting area AA2. In some optional embodiments, the first connection terminals 23 and the second connection terminals 24 may be located at a side of the light-emitting area AA1 facing toward the binding area AA3. With such settings, when the light-emission driving substrate 100 is used in a display device, a driving circuit board bound to the first connection terminals 23 and the second connection terminals 24 and a driving circuit board connected to a driving chip which is bound to the binding area AA3 are all located at a same side of the light-emitting area AA1, that is, it is sufficient to set a stepped area at one side of the light-emitting area AA1 of the light-emitting panel, and thus the number of steps required by bonding the driving circuit boards in the display device can be reduced.

Still referring to FIG. 5, in some embodiments, in the light-emission driving substrate 100 according to the embodiments of the present application, the plurality of first connection terminals 23 and the plurality of second connection terminals 24 may be disposed in one row and one column, that is, the plurality of first connection terminals 23 and the plurality of second connection terminals 24 may be arranged in a same direction at intervals. With such settings, width of the non-light-emitting area AA2 can be reduced as much as possible, that is, the width of the non-light-emitting area AA2 in a direction from the light-emitting area AA1 to the non-light-emitting area AA2 is smaller, which satisfies requirements for a narrower frame.

In some embodiments, in the light-emission driving substrate 100 according to the embodiments of the present application, the plurality of first signal lines 21 and the plurality of second signal lines 22 may be arranged along the first direction X at intervals, and particularly may be parallel and spaced apart from each other. Such settings facilitate arrangement of the first signal lines 21 and the second signal lines 22 to satisfy requirements for electrical connections with the anode 200a and the cathode 200b of the light emitting element 200.

Figure 6:
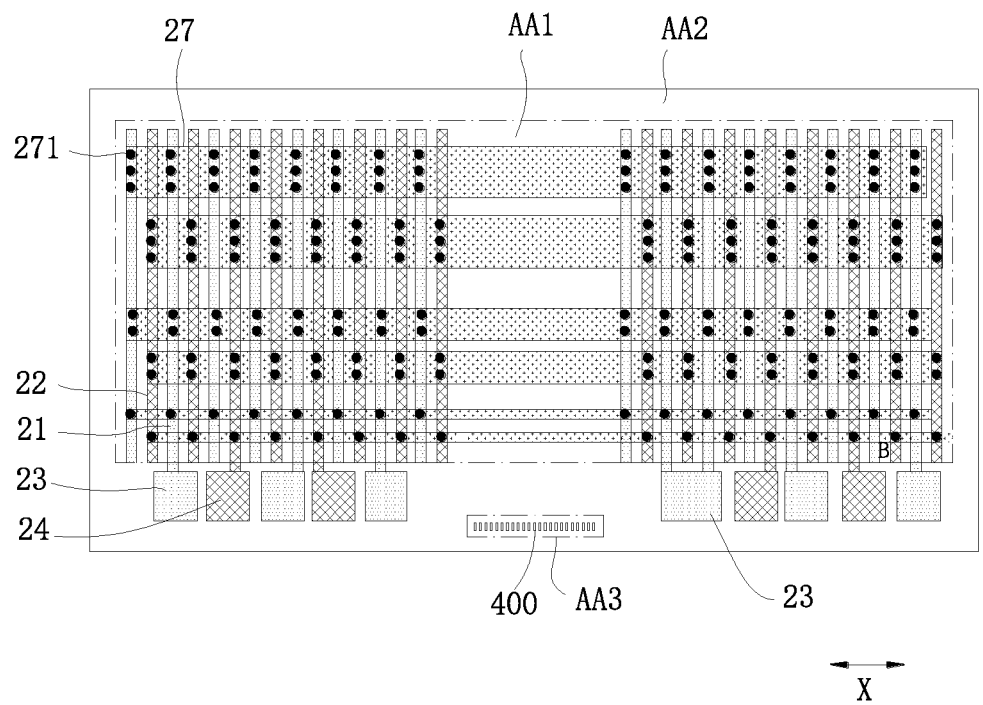
FIG. 6 is a wiring diagram of a part of a light-emission driving substrate according to still another embodiment of the present application.

Referring to FIG. 6, in some embodiments, if each of the first signal lines 21 is connected to one first connection terminal 23 and each of the second signal lines 22 is connected to one second connection terminals 24, it requires a relatively large number of first connection terminals 23 and second connection terminals 24. However, positions for placing the first connection terminals 23 and the second connection terminals 24 are limited. Thus, in the light-emission driving substrate 100 according to the embodiments of the present application, each first connection terminal 23 may be electrically connected with at least one first signal line 21, and each second connection terminal 24 may be electrically connected with at least one second signal line 22, that is, each first connection terminal 23 may be electrically connected with two or more first signal lines 21 and each second connection terminal 24 may be electrically connected with two or more second signal lines 22. With such settings, transmission of electrical signals can be ensured, thereby satisfying requirements for controlling the light-emitting elements 200.

Still referring to FIG. 6, in some embodiments, in the light-emission driving substrate 100 according to the embodiments of the present application, the device layer 20 may further include a plurality of bridging lines 27 that are disposed in the light-emitting area AA1, and each of the plurality of first signal lines 21 is electrically connected through at least one of the bridging lines 27, and each of the plurality of second signal lines 22 is electrically connected through at least one of the bridging lines 27.

With such settings, in a case where the number of the first connection terminals 23 is less than the number of the first signal lines 21 and the number of the second connection terminals 24 is less than the number of the second signal lines 22, it ensures that each first signal line 21 can obtain a voltage signal from the first connection terminals 23, and each second signal line 22 can obtain a voltage signal from the second connection terminals 24, so as to satisfying requirements of the light-emitting elements 200 for light-emission.

Furthermore, in the case where the first connection terminals 23 and the second connection terminals 24 are all located at the side of the light-emitting area AA1 facing toward the binding area AA3, uniformity in voltage will be deteriorated. By providing the bridging lines 27 and setting that each of the plurality of first signal lines 21 is electrically connected through at least one bridging line 27 and each of the plurality of second signal lines 22 is electrically connected through at least one bridging line 27, uniformity in voltage in the light-emission driving substrate 100 can be optimized and thus a voltage drop of the first signal line 21 and of the second signal line 22 can be reduced.

In some embodiments, in the light-emission driving substrate 100 according to the embodiments of the present application, each of the bridging lines 27 is a straight line segment, and the plurality of bridging lines 27 are spaced apart from each other and have line-width that are increasing along a direction away from the binding area AA3. It can be known from analysis that attenuation in current gradually becomes serious from an output terminal of a first connection terminal 23 or an output terminal of a second connection terminal 24 to an upper part of a display area away from the binding area AA3, which is caused by increasing resistance of an involved line. By setting that the plurality of bridging lines 27 are spaced apart from each other and have line-widths that are increasing along the direction away from the binding area AA3, resistance of the first signal line 21 and of the second signal line 22 at positions away from the binding area AA3 are reduced, i.e. resistance of the involved line at the upper part is reduced, which can effectively compensate attenuation in current of the line at the upper part so as to improve uniformity in voltage.

In some embodiments, in the light-emission driving substrate 100 according to the embodiments of the present application, the first signal lines 21 and the second signal lines 22 are respectively arranged in a different layer from the bridging lines 27, and each of the bridging lines 27 is electrically connected to a corresponding first signal line 21 or a corresponding second signal line 22 through a via 271. Such settings facilitate electrical connection between a bridging line 27 and a corresponding first signal line 21 or a corresponding second signal line 22 and formation of the bridging lines 27 as well.

In some embodiments, in the light-emission driving substrate 100 according to the embodiments of the present application, the number of orthographic projections of the vias 271 covered by orthographic projections of the bridging lines 27 on the substrate 10 increases along the direction away from the binding area AA3. With such settings, resistance of an involved line at the upper side can be further reduced, and attenuation in current at the upper side can be effectively compensated, and that uniformity in voltage can be efficiently improved.

Figure 7:
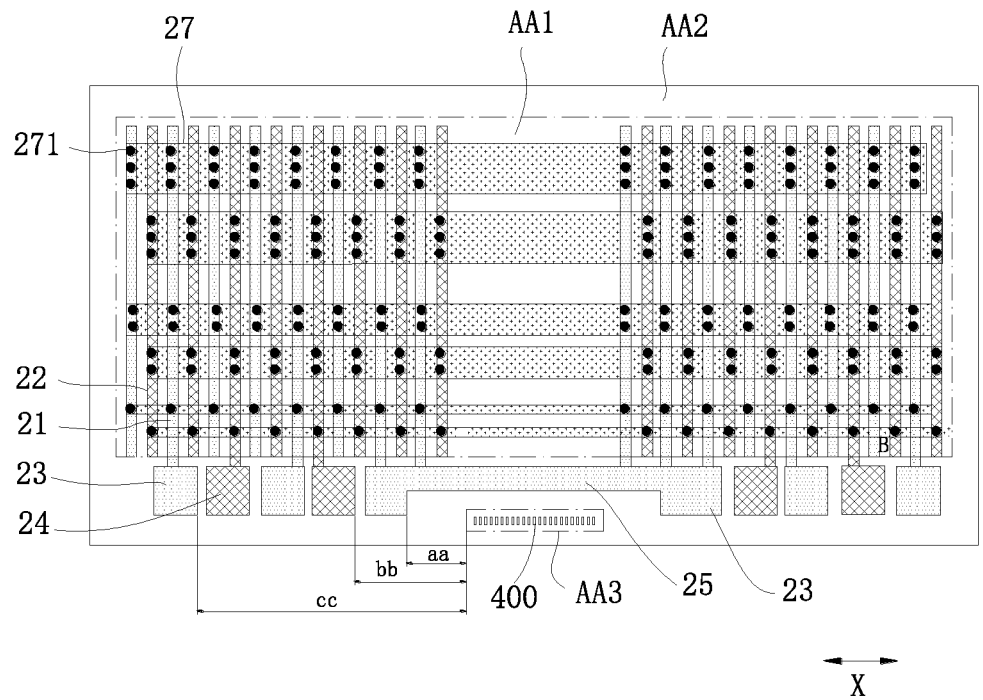
FIG. 7 is a wiring diagram of a part of a light-emission driving substrate according to still another embodiment of the present application.

Referring to FIG. 7, in some alternative embodiments, in the light-emission driving substrate 100 according to the embodiments of the present application, the device layer 20 may further include a first transition line 25 that is disposed in the non-light-emitting area AA2, at least two first connection terminals 23 are electrically connected through the first transition line 25, and a part of the plurality of first signal lines 21 is electrically connected to the first transition line 25.

As described above, due to a limited area of the non-light-emitting area AA2, there is no enough space to set a first connection terminal 23 for each of the first signal lines 21. Therefore, by providing the first transition line 25, a first connection terminal 23 not only can be directly electrically connected to a first signal line 21 that is located adjacently but also can be indirectly electrically connected to a first signal line 21 that is located far away through the first transition line 25.

In addition, in a situation where the first connection terminals 23 obtain power from an outside world, the number of power supplies connecting with the first connection terminals 23 is relatively small. By electrically connecting at least two of the first connection terminals 23 through the first transition line 25, inputted voltage will be transmitted to different areas through the first transition line 25 before it is transmitted to the light-emitting area AA1, i.e. when it is still in the non-light-emitting area AA2, and after transmitted to different areas in the light-emitting area AA1, there is only a small voltage difference among the different areas, which ensures uniformity in brightness of respective light-emitting elements 200.

In some embodiments, in the light-emission driving substrate 100 according to the embodiments of the present application, in the first direction X, at least one first connection terminal 23 is provided at each of the sides of the binding area AA3 in the first direction X, and for each of the sides, a distance between at least one first connection terminal 23 and the binding area AA3 is smaller than a distance between each second connection terminal 24 and the binding area AA3. In some embodiments, two first connection terminals 23 that are located at respective sides of the binding area AA3 in the first direction X and are closest to the binding area AA3 may be connected through the first transition line 25. Such settings facilitate bridging of the binding area AA3, thereby satisfying requirements of first signal lines that are located above the binding area for connections and ensuring uniformity of light-emitting surfaces.

In some embodiments, the first transition line 25 may be a straight line segment and is disposed between the binding area AA3 and the light-emitting area AA1. While satisfying requirements for bridging the binding area AA3, a space between the binding area and the light-emitting area can be fully utilized to avoid a risk of the circuit being shorted with other lines.

Still referring to FIG. 7. in some embodiments, in the light-emission driving substrate 100 according to the embodiments of the present application, a distance cc between at least one first connection terminal 23 and the binding area AA3 is greater than the distance bb between each of the second connection terminals 24 and the binding area AA3. That is, at least one first connection terminal 23 is disposed farther from the binding area AA3 than each of the second connection terminals 24. Particularly, the minimum distance cc between at least one first connection terminal 23 and the binding area AA3 may be greater than the minimum distance bb between each of the second connection terminals 24 and the binding area AA3. In other words, one of the plurality of first connection terminals 23 includes a second side close to the binding area AA3 and the binding area AA3 includes a third side close to the first connection terminal 23, the minimum distance cc may then refers to a length dimension of a minimum distance between the second side and the third side, such as that as indicated by the notation cc in FIG. 7. The pixel driving circuits 10a are disposed in an in-plane array, that is to say, there is also a pixel driving circuit 10a at an edge position away from the binding area AA3, and accordingly, it is necessary to provide the first signal lines 21. If all of the first connection terminals 23 are disposed close to the binding area AA3, a first signal line 21 located far away from the binding area AA3 has to extend a longer distance toward the binding area AAA3 in order to connect with a first connection terminal 23 to obtain voltage from the first connection terminal 23. Referring to previous analysis, the longer the first signal line 21 is, the greater the voltage drop is. Therefore, by setting that the distance cc between at least one first connection terminal 23 and the binding area AA3 is greater than the distance bb between each of the second connection terminals 24 and the binding area AA3 so as to provide the voltage to the first signal line 21 that is disposed far from the binding area AA3, it not only can facilitate distribution of the first signal lines 21, but also can improve uniformity of light-emitting surfaces.

In some embodiments, in the light-emission driving substrate 100 according to the embodiments of the present application, both a first connection terminal 23 and a second connection terminal 24 are provided at each of the sides of the binding area AA3 in the first direction X, and for each of the sides in the first direction X, a minimum distance between at least one first connection terminal 23 and the binding area AA3 is greater than a minimum distance between each second connection terminal 24 and the binding area AA3.

In some embodiments, an outermost connection terminal at each of the sides of the binding area AA3 in the first direction X may be the first connection terminal 23.

In some embodiments, in the light-emission driving substrate 100 according to the embodiments of the present application, the second connection terminals 24 may be directly electrically connected to corresponding second signal lines 22.

Figure 8:
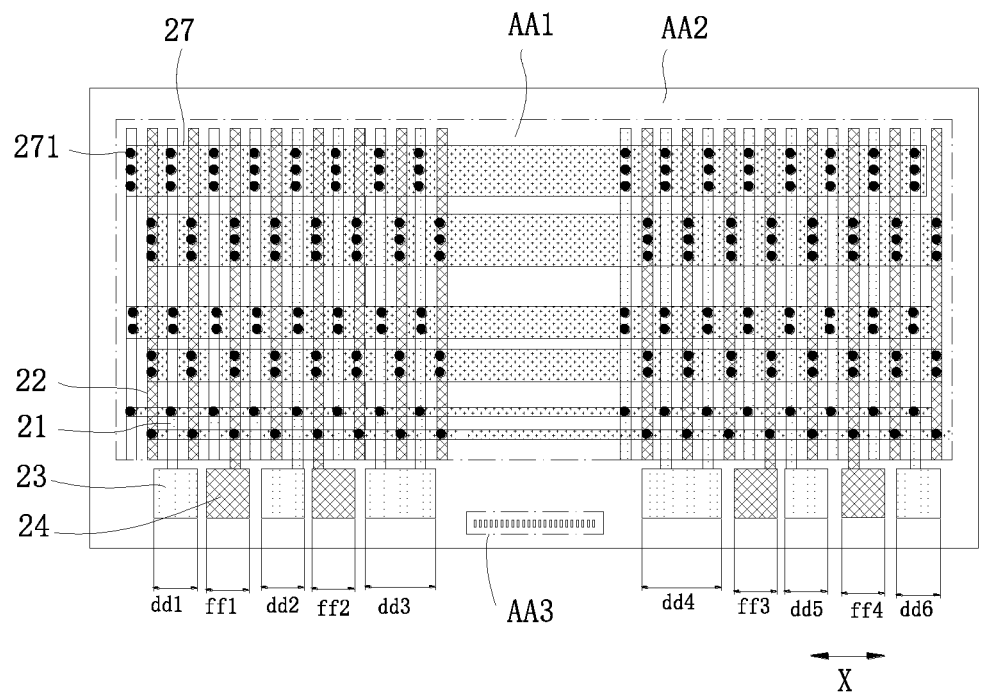
FIG. 8 is a wiring diagram of a part of a light-emission driving substrate according to still another embodiment of the present application.

Referring to FIG. 8, in some alternative embodiments, in the light-emission driving substrate 100 according to the embodiments of the present application, the first connection terminals 23 and the second connection terminals 24 are arranged along a same direction at intervals, and in the direction of arrangement of the first connection terminals 23 and the second connection terminals 24, a sum of lengths of the first connection terminals 23 is A, and a sum of lengths of the second connection terminals 24 is B, wherein A≥B.

The length of the first connection terminal 23 or the second connection terminal 24 may refers to an extension dimension of the first connection terminal 23 or the second connection terminal 24 in the direction for arrangement of the first connection terminals 23 and the second connection terminals 24.

Taking the arrangement of the first connection terminals 23 and the second connection terminals 24 along the first direction X as an example, each of the first connection terminals 23 includes two sides that are opposite with each other in the first direction X, and the length of the first connection terminal 23 is a minimum distance between the two sides in the first direction X, illustratively shown as dd1 in FIG. 8. Each of the second connection terminals 24 includes two sides that are opposite with each other in the first direction X, and the length of the second connection terminal 24 is a minimum distance between the two sides in the first direction X, illustratively shown as ff1 in FIG. 8.

Taking the embodiment shown in FIG. 8 as an example, the sum of lengths of the first connection terminals 23 is A, and the sum of lengths of the second connection terminals 24 is B, where A=dd1+dd2+dd3+dd4+dd5+dd6, B=ff1+ff2+ff2+ff2; and A>B. It should be understood that, A>B is only given in an implementation, and in some embodiments, it may be that A=B.

Since each of the first connection terminals 23 is electrically connected to an anode 200a of a light-emitting element 200 through a first signal line 21, and each of the second connection terminals 24 is electrically connected to a cathode 200b of a light-emitting element 200 through a second signal line 22, fluctuation in voltage of a first signal line 21 connecting with the anode 200a has a greater effect on an output current of the driving transistor in the device layer 20 than fluctuation in voltage of a second signal line 22 connecting the cathode 200b. By setting a greater length for the first connection terminal 23 in the arrangement direction, a voltage drop of the first signal line 21 can be reduced and uniformity of the panel can be improved.

In some embodiments, the first connection terminals 23 and the second connection terminals 24 are arranged at intervals along the first direction X.

Figure 9:
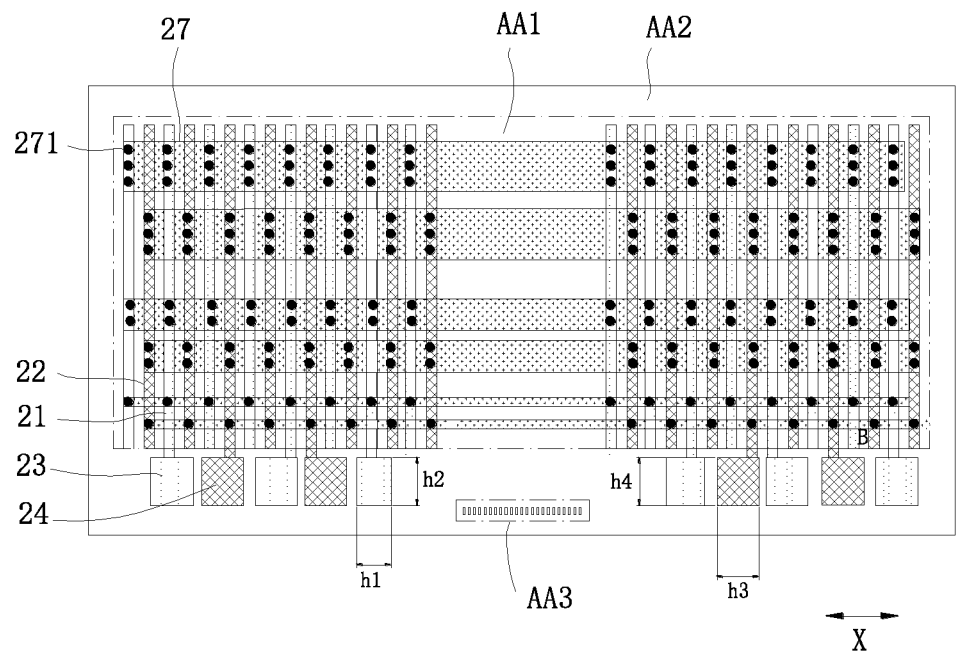
FIG. 9 is a wiring diagram of a part of a light-emission driving substrate according to still another embodiment of the present application.

Referring to FIG. 9, in some alternative embodiments, according to an aspect of the embodiments of the present application, a sum of orthographic projection areas of the first connection terminals 23 on the substrate 10 is C, and a sum of orthographic projection areas of the second connection terminals 24 on the substrate 10 is D, wherein C≥D.

Taking the orthographic projection of the first connection terminal 23 and the second connection terminal 24 on the substrate being rectangle as an example, the area of each first connection terminal 23 is a product of h1 and h2, and the area of each second connection terminal 24 is a product of h3 and h4, wherein the h1, the h2, the h3 and the h4 are determined depending on length and width of a corresponding connection terminal, and thus are not constant values.

The sum C of the orthographic projection areas of the first connection terminals 23 on the substrate 10 is equal to a sum obtained by addition of the orthographic projection areas of the first connection terminals 23 on the substrate 10, and the sum D of the orthographic projection areas of the second connection terminals 24 on the substrate 10 is equal to a sum obtained by addition of the orthographic projection areas of the first connection terminals 23 on the substrate 10.

By setting a greater area for the first connection terminal 23 on the substrate 10, a possibility that fluctuation in voltage of the first signal lines 21 can be reduced, and uniformity of light-emitting surfaces can be improved.

It should be understood that, it is just an implementation that the orthographic projection of the first connection terminal 23 and the second connection terminal 24 on the substrate 10 is a rectangle, and the embodiments of the present application is not limited to such an implementation. In some other examples, the orthographic projection of the first connection terminal 23 and of the second connection terminal 24 on the substrate 10 may be a circle, an ellipse or any other polygonal shape, and wherein the first connection terminal 23 and the second connection terminal 24 may be the same, for example, both of them are in the shape of rectangle or circle, or the first connection terminal 23 and the second connection terminal 24 may be different from each other, for example, one of them is in the shape of circular and the other is the shape of rectangular, or the like, as long as functional requirements of the light-emission driving substrate 100 can be satisfied.

Figure 10:
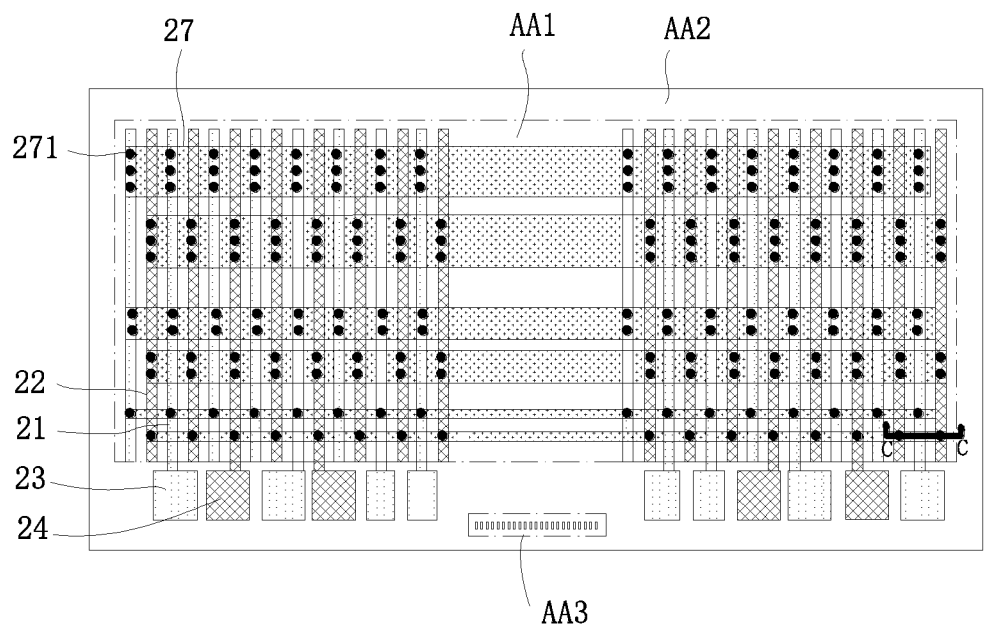
FIG. 10 is a wiring diagram of a part of a light-emission driving substrate according to still another embodiment of the present application.

Referring to FIG. 10, in some embodiments, the number of the first connection terminals 23 may be greater than the number of the second connection terminals 24. Taking FIG. 9 as an example, the number of the first connection terminals 23 may be 8 and the number of the second connection terminals 24 may be 4. By setting a greater number for the first connection terminals 23, a possibility that fluctuation in voltage of the first signal lines 21 can be reduced, and uniformity of light-emitting surfaces can be improved.

Figure 11:
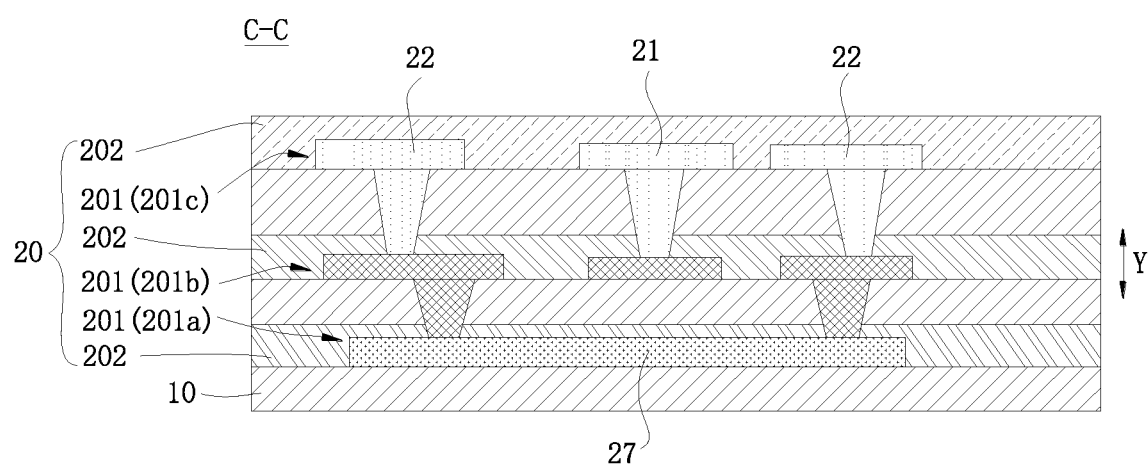
FIG. 11 is a sectional view along a C-C direction in FIG. 10.

Referring to FIG. 11, in some embodiments, in the light-emission driving substrate 100 according to the embodiments of the present application, the device layer 20 may include a plurality of metal layers 201 that are stacked in layers and insulating layers 202 each of which is disposed between two adjacent metal layers. The first signal lines 21, the second signal lines 22, the first connection terminals 23, the second connection terminals 24 and the bridging line 27 are all formed in the metal layers 201, the first connection terminals 23 and the first signal lines 21 are disposed in a same layer, the second connection terminals 24 and the second signal lines 22 are disposed in a same layer, and the bridging lines 27 are disposed in a different layer from the first signal lines 21 and the second signal lines 22. Such settings facilitate formation of the first signal lines 21, the second signal lines 22, the first connection terminals 23, the second connection terminals 24 and the bridging lines 27, and as well electrical connection between the first connection terminals 23 and the first signal lines 21 and electrical connection between the second connection terminals 24 and the second signal lines 22. Moreover, since the bridging lines 27 are disposed in a different layer from the first signal lines 21 and the second signal lines 22, such arrangement facilitate electrical connections of the bridging lines 27 with corresponding first signal lines 23 and second signal lines 24, and avoid a shorted circuit caused by electrical connection between a bridging line 27 connecting with a first signal line 21 and a second signal line 22.

In some alternative embodiments, the plurality of metal layers 201 may include a first metal layer 201a, a second metal layer 201b and a third metal layer 201c which are successively arranged, and insulating layers 202 each of which is disposed between two adjacent metal layers, wherein the first metal layer 201a is located between the second metal layer 201b and the substrate 10. In some embodiments, the bridging lines 27 may be formed in the first metal layer 201a, the first signal lines 21 may be formed in the second metal layer 201b and the third metal layer 201c, parts of the first signal line 21 formed in the second metal layer 210b and the third metal layer 201c are electrically connected to each other, and the part of the first signal lines 21 formed in the second metal layer 201b is electrically connected to the bridging lines 27 through vias 271. The second signal lines 22 are formed in the second metal layer 201b and the third metal layer 201c, parts of the second signal lines 22 formed in the second metal layer 201b and the third metal layer 201c are electrically connected to each other, and the part of the second signal lines 22 formed in the second metal layer 201b is electrically connected to the bridging lines 27 through vias 271. The first connection terminals 23 are disposed in the second metal layer 201b or the third metal layer 201c, and the second connection terminals 24 are disposed in the second metal layer 201b or the third metal layer 201c.

It should be understood that the number of metal layers 201 and in which metal layer 201 each of the first signal line 21, the second signal line 22, the first connection terminal 23, the second connection terminal 24 and the bridging line 27 is located described above is just an implementation, and in some optional embodiments, the number of metal layers may be two or four, and the first signal lines 21, the second signal lines 22, the first connection terminals 23, the second connection terminals 24 are not limited to be disposed in the same layer, and in some other examples, they may be disposed in different layers. For example, in some embodiments, each of the first signal lines 21 may be correspondingly connected to one first connection terminal 23, each of the second signal lines 22 is correspondingly connected to one second connection terminal 24, so the first signal lines 21 and the second signal lines 22 can be disposed in different layers, and in such case, it is not necessary to set the bridging lines 27, as long as requirements of an electrical connection between the anode 200a and the cathode 200b of the light-emitting element can be satisfied.

As an optional implementation, in the light-emission driving substrate 100 according to the embodiments of the present application, the first signal lines 21 and the second signal lines 22 may be respectively power lines, the first connection terminals 23 together with the first signal lines 21 are configured to transmit positive potential signals, and the second connection terminals 24 together with the second signal lines 22 are configured to transmit negative potential signals.

As analyzed above, brightness of the light-emitting element 200 is critically determined by a voltage difference between the gate and the source of the driving transistor in the pixel driving circuit 10a, and the voltage at the gate of the driving transistor is inputted from the data line Vdata, and the voltage at the source is the voltage at the first connection terminal, so by providing the first signal lines 21 for transmitting positive potential signals and the second connection terminals 24 together with the second signal lines 22 for transmitting negative potential signals, not only illumination effect of the light-emitting element 200 can be satisfied, but also the voltage drop in the first signal line 21 when bridging the binding area AA3 can be reduced, thereby reducing an effect on an output current of the driving transistor in the pixel driving circuit 10a. The uniformity of light-emitting surfaces can be ensured while requirements of driving the light-emitting elements 200 can be satisfied as well.

Figure 12:
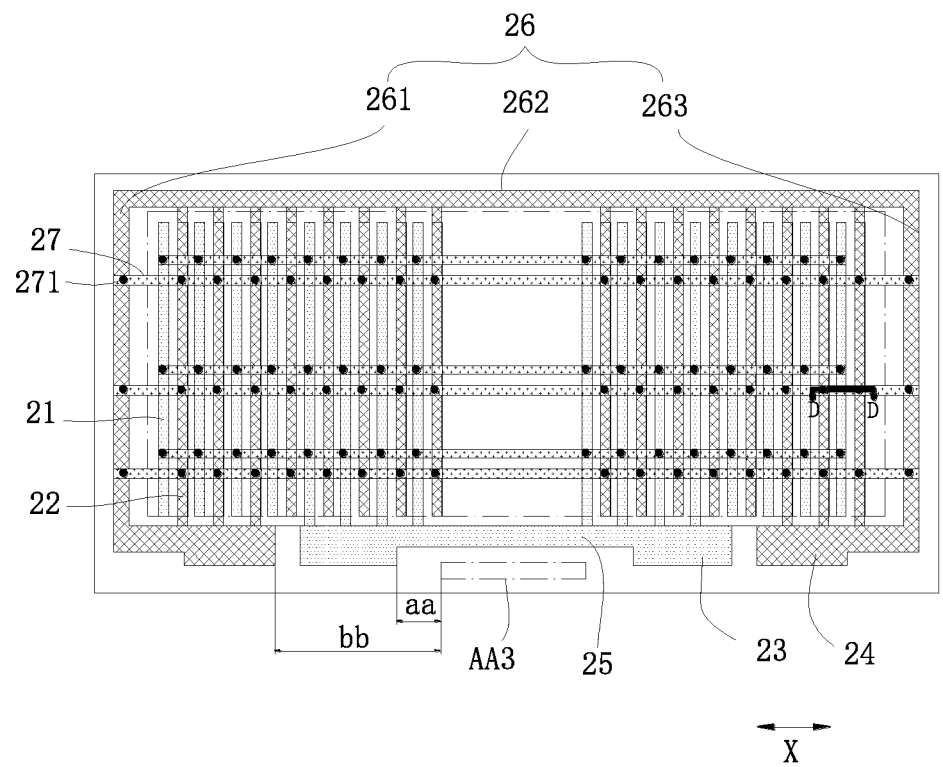
FIG. 12 is a wiring diagram of a part of a light-emission driving substrate according to still another embodiment of the present application.
Figure 13:
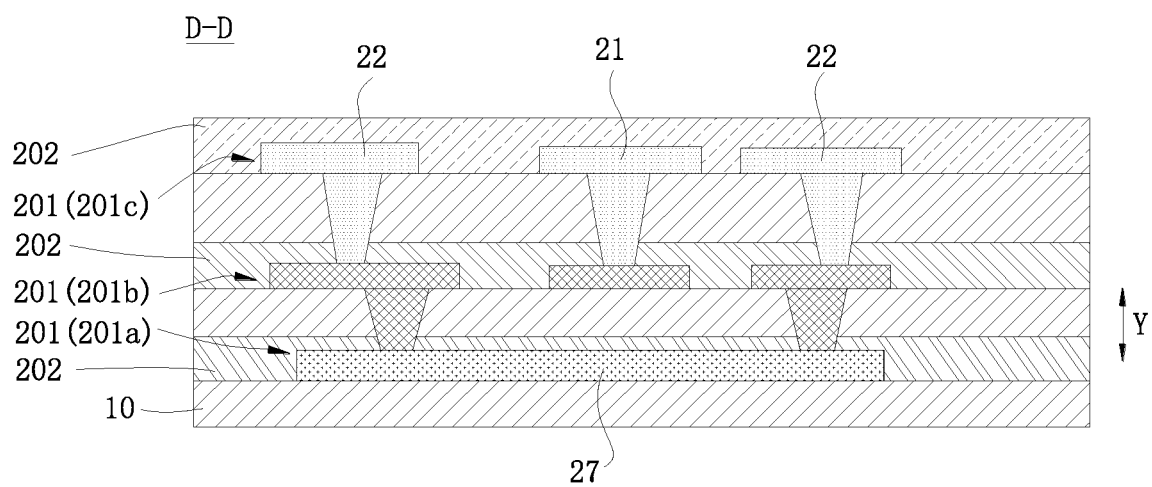
FIG. 13 is a sectional view along a D-D direction in FIG. 12.

Referring to FIG. 12 and FIG. 13, as an optional implementation, the light-emission driving substrate 100 according to the embodiments of the present application may further include a second transition line 26 that is disposed in the non-light-emitting area AA2, at least two second connection terminals 24 are electrically connected through the second transition line 26 and a part of the second signal lines 22 is electrically connected to the second transition lines 26. By providing the second transition lines 26, a second connection terminal 24 not only can be directly electrically connected to a second signal line 22 that is located adjacently, but also can be electrically connected to a second signal line 22 that is located far away through the second transition lines 26. Moreover, inputted voltage will be transmitted to different areas through the second transition line 26 before it is transmitted to the light-emitting area AA1, i.e. when it is still in the non-light-emitting area AA2, and after transmitted to different areas in the light-emitting area AA1, there is only a small voltage difference among the different areas, which ensures uniformity in brightness of respective light-emitting elements 200.

In some optional embodiments, the second transition line 26 may include a first segment 261, a second segment 262 and a third segment 263 that are successively arranged. The first segment 261 and the third segment 263 are spaced apart from each other and are disposed oppositely, and the second segment 262 intersects with the first segment 261 and the third segment 263, one end of the first segment 261 in its own extension direction is electrically connected to the second segment 262 and the other end of the first segment 261 is electrically connected to one of the plurality of second connection terminals 24, and one end of the third segment 263 in its own extension direction is electrically connected to the second segment 262 and the other end of the third segment 263 is electrically connected to another one of the plurality of second connection terminals 24.

In the light-emission driving substrate 100 according to the embodiments of the present application, since the second transition line 26 adopts the above-described structure, it facilitates connections between the second connection terminals 24 and respective second signal lines 22, and satisfies requirements of transmission of signals.

In some embodiments, each of the first segment 261, the second segment 262 and the third segment 263 may be a straight line segment. As an optional implementation, the second segment 262 may extend along the first direction X, and the first segment 261 and the third segment 263 respectively intersects with the second segment 262, and particularly, may be perpendicular to the second segment 262.

In some embodiments, in the light-emission driving substrate 100 according to the embodiments of the present application, the second connection terminals 24 may be disposed at outermost positions at respective side of the binding area AA3 in the first direction X, and in the first direction X, the two outermost second connection terminals 24 are electrically connected through the second transition line 26.

It should be understood that, in the light-emission driving substrate 100 according to the above-described embodiments of the present application, the respective distances are described by taking that the first connection terminals 23 and the second connection terminals 24 are arranged in one row and one column and spaced apart from each other along the first direction X as an example, which is just an implementation, and the embodiments of the present application is not limited to the implementation, and in some other embodiments, the first connection terminals 23 and the second connection terminals 24 may be arranged in multiple rows and columns.

Figure 14:
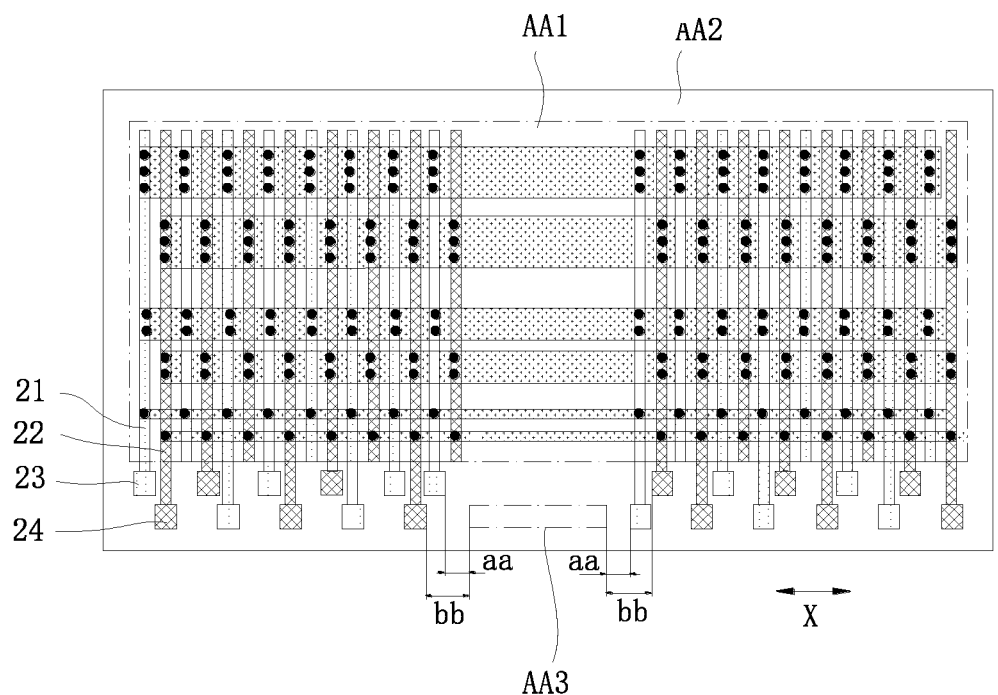
FIG. 14 is a wiring diagram of a part of a light-emission driving substrate according to still another embodiment of the present application.

Referring to FIG. 14, exemplarily, the first connection terminals 23 and the second connection terminals 24 may be arranged in two rows and two columns, and for each row, a distance aa between at least one first connection terminal 23 and the binding area AA3 is greater than a distance bb between each second connection terminal 24 and the binding area AA3.

Figure 15:
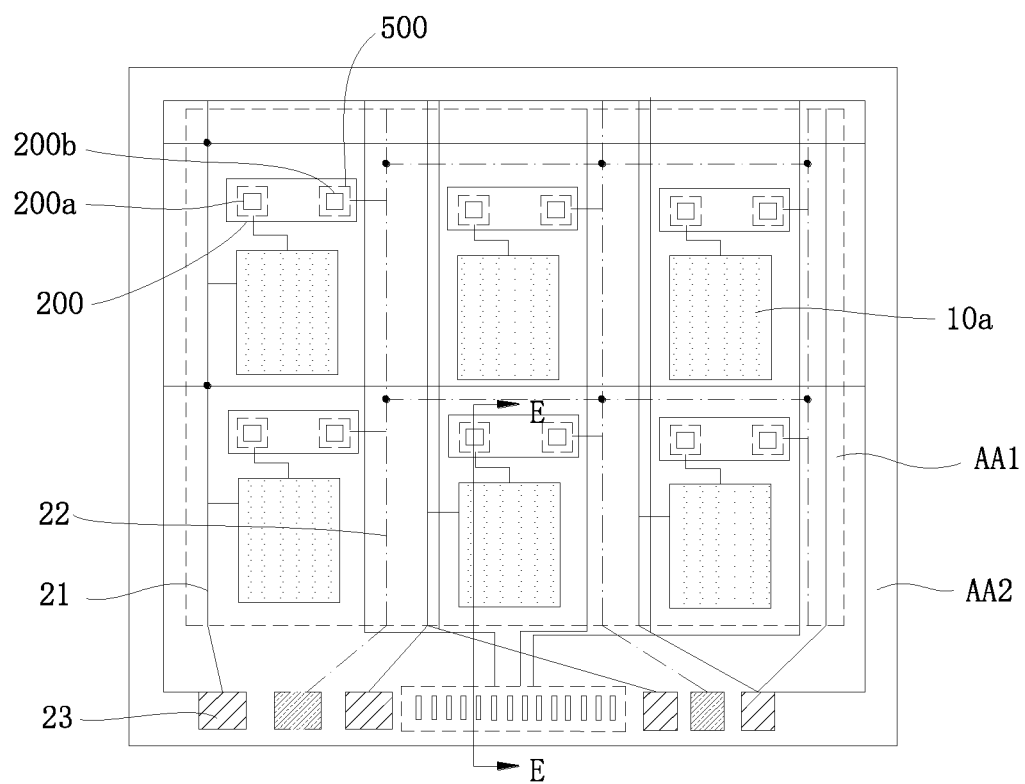
FIG. 15 is a schematic top view of a light-emitting panel according to an embodiment of the present application.
Figure 16:
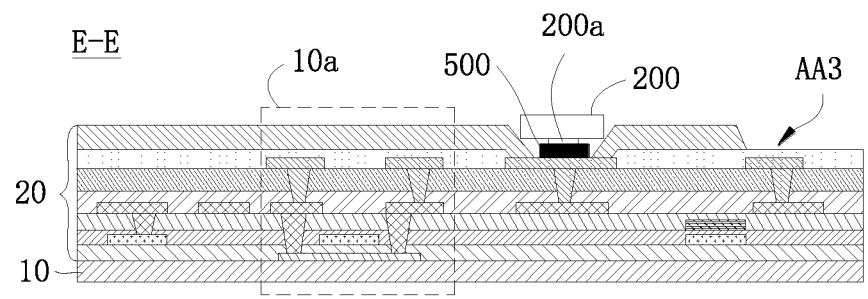
FIG. 16 is a sectional view along a E-E direction in FIG. 15.

Referring to FIG. 15 and FIG. 16, in another aspect, the embodiments of the present application further provides a light-emitting panel, including the above-described light-emission driving substrate 100 and a light-emitting layer, wherein the light-emitting layer is stacked on a side of the device layer 20 away from the substrate 10 and is located in the light-emitting area AA1, and wherein the light-emitting layer includes light-emitting elements 200 that are distributed in an array, and an anode 200a of a light-emitting element 200 is electrically connected to a first signal line 21 and a cathode 200b of the light-emitting element 200 is electrically connected to a second signal line 22. In order to satisfy requirements of connection of a first signal line 21 and of a second signal line 22 with the anode 200a and the cathode 200b of a light-emitting element 200, the light-emission driving substrate 100 may include pads 500 corresponding to the first signal line 21 and the second signal line 22, in order for electrical connections with the anode 200a and the cathode 200b.

The light-emitting panel according to the embodiments of the present application includes the light-emission driving substrate 100 described in the above-mentioned embodiments, so the light-emitting element 200 is driven by the light-emission driving substrate 100, which can satisfy light-emission requirements, and due to inclusion of the light-emission driving substrate 100 described in the above-mentioned embodiments, a voltage drop of a first signal line 21 when bridging the binding area AA3 can be reduced, and an effect on an output current of the driving transistor in the pixel driving circuit 100a can be reduced. Uniformity of light-emitting surfaces can be ensured while satisfying requirements of driving the light-emitting elements 200.

In some embodiments, in the light-emitting panel according to the embodiments of the present application, the light-emitting element 200 included in the light-emitting layer may be a mini LED or micro LED, and each light-emitting element 200 may be transferred onto the light-emission driving substrate 100 by way of a transferring method and may be connected to the pixel driving circuit 10a in the device layer 20 by way of an assembling method.

It should be understood that the light-emitting element 200 is not limited to be a mini LED or a micro LED. In some other embodiments, the light-emitting element 200 may be an OLED. In a case where the light-emitting element 200 is an OLED, the anode 200a for the light-emitting element 200 may be formed after the device layer 20 is formed so as to electrically connect to the driving transistor of the pixel driving circuit 10a of the device layer 20, and then the light-emitting element of the OLED is formed, followed by formation of the cathode 200b on the light-emission device layer 20. The cathode 200b may be a surface electrode, and the cathode 200b may be electrically connected to the second signal line 22 on the device layer 20 through the via 271, to meet requirements of driving the light emitting element 200.

In the light-emitting panel according to the embodiments of the present application, in a case where the light-emitting element 200 is a mini LED, the light-emitting panel may be used as a backlight panel of a liquid crystal display panel. In a case where the light-emitting element 200 is an OLED or a micro LED, the light-emitting panel may be used as a display panel.

Figure 17:
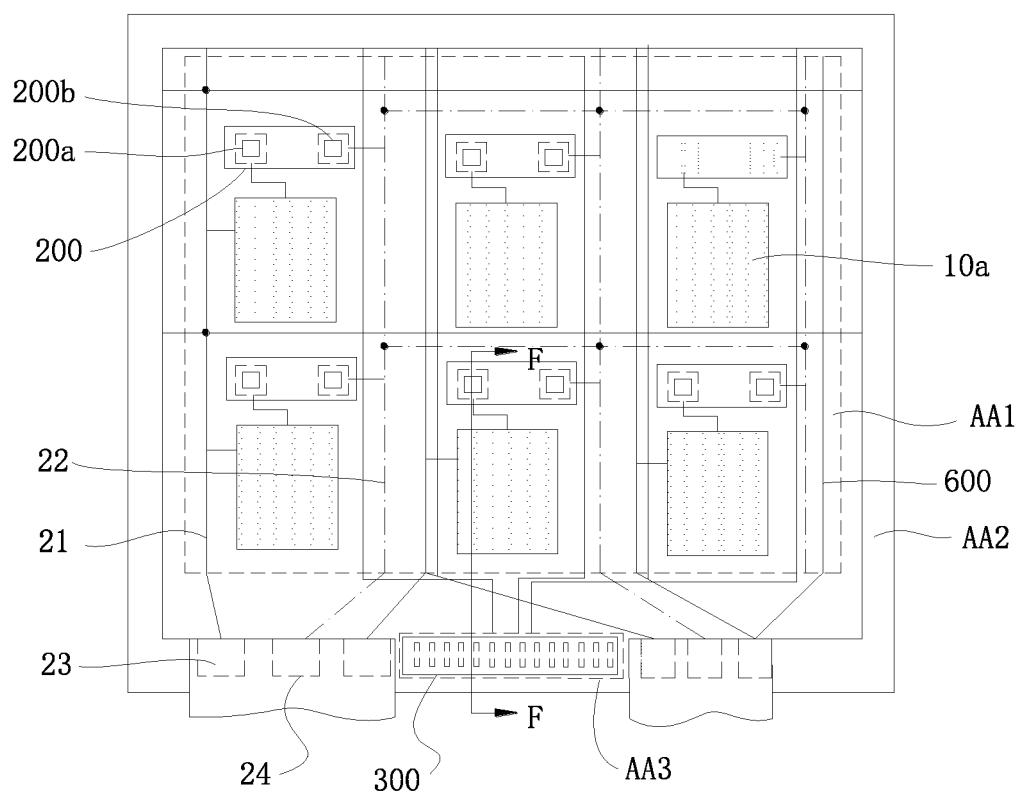
FIG. 17 is a schematic top view of a display device according to an embodiment of the present application.
Figure 18:
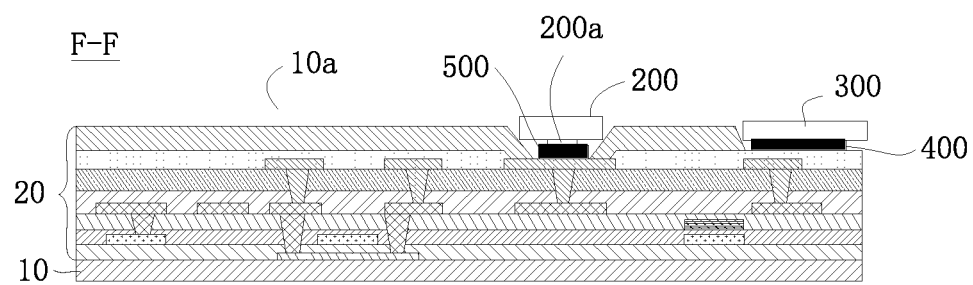
FIG. 18 is a sectional view along an F-F direction in FIG. 17.

Referring to FIG. 17 and FIG. 18, in another aspect, the embodiments of the present application further provides a display device, which includes the light-emitting panel described in the above-mentioned embodiments and a driving chip 300. The driving chip 300 is disposed in the binding area AA3, and is specifically connected with the binding terminals 400 in the binding area AA3. In some embodiments, the binding terminal 400 in the binding area AA3 is electrically connected to a data line 600, so that upon the driving chip 300 is bound to the binding area AA3, data signals can be provided to the data line 600 through the driving chip 300.

Since the display device according to the embodiments of the present application includes the light-emitting panel described in the above-mentioned embodiments and the light-emitting element 200 is driven by the light-emission driving substrate 100, the length of a part of the first signal line 21 connecting with the first connection terminal 23 that bridges the binding area AA3 can be reduced, and thus a voltage drop of the first signal line 21 when it bridges the binding area AA3 can be reduced, thereby reducing an effect on an output current of the driving transistor, and satisfying requirements of driving the light-emitting elements 200 while ensuring uniformity of light-emitting surfaces.

While the application has been described with reference to the preferred embodiments, various modifications may be made and equivalents may be substituted for parts thereof without departing from the scope of the application. In particular, as long as there is no structural conflict, each technical feature mentioned in each embodiment can be combined in any manner. The present application is not limited to the specific embodiments disclosed herein, but includes all technical solutions falling within the scope of the claims.

What is claimed is:

1. A light-emission driving substrate for driving light-emitting elements, the light-emission driving substrate comprises a light-emitting area and a non-light-emitting area that is disposed around at least a part of the light-emitting area, and the non-light-emitting area comprises a binding area for binding a driving chip, wherein the light-emission driving substrate comprises:
a substrate; and
a device layer disposed on the substrate, wherein the device layer comprises a plurality of first signal lines and second signal lines that are disposed in the light-emitting area, and comprises a plurality of first connection terminals and second connection terminals that are disposed in the non-light-emitting area, each of the plurality of first connection terminals is electrically connected to an anode of the light-emitting element through the one of the plurality of first signal lines, and each of the second connection terminals is electrically connected to a cathode of the light-emitting element through one of the second signal lines;
wherein a distance between at least one of the plurality of first connection terminals and the binding area is smaller than a distance between each of the second connection terminals and the binding area.

2. The light-emission driving substrate according to claim 1, wherein the binding area comprises two sides that are opposite with each other in a first direction, and at least one of the plurality of first connection terminals is provided at each of the sides of the binding area in the first direction.

3. The light-emission driving substrate according to claim 2, wherein for each of the sides of the binding area in the first direction, a distance between at least one of the plurality of first connection terminals and the binding area is smaller than a distance between each of the second connection terminals and the binding area.

4. The light-emission driving substrate according to claim 1, wherein a distance between at least one of the plurality of first connection terminals and the binding area is greater than the distance between each of the second connection terminals and the binding area.

5. The light-emission driving substrate according to claim 1, wherein the plurality of first connection terminals and the second connection terminals are located at a side of the light-emitting area facing toward the binding area.

6. The light-emission driving substrate according to claim 1, wherein the device layer further comprises a first transition line that is disposed in the non-light-emitting area, at least two of the plurality of first connection terminals are electrically connected through the first transition line, and a part of the plurality of first signal lines is electrically connected to the first transition line.

7. The light-emission driving substrate according to claim 6, wherein the first transition line is disposed between two adjacent of the plurality of first connection terminals, one end of the first transition line in an extension direction of the first transition line is electrically connected with one of the two adjacent of the plurality of first connection terminals, and the other end of the first transition line is electrically connected with the other of the two adjacent of the plurality of first connection terminals.

8. The light-emission driving substrate according to claim 1, wherein the device layer further comprises a second transition line in the non-light-emitting area, at least two second connection terminals are electrically connected through the second transition line, and a part of the plurality of second signal lines is electrically connected to the second transition line.

9. The light-emission driving substrate according to claim 8, wherein the second transition line comprises a first segment, a second segment and a third segment that are successively arranged, the first segment and the third segment are spaced apart from each other and disposed oppositely, the second segment intersects with the first segment and the third segment, one end of the first segment in an extension direction of the first segment is electrically connected to the second segment and the other end of the first segment is electrically connected to one of the plurality of second connection terminals, and one end of the third segment in an extension direction of the third segment is electrically connected to the second segment and the other end of the third segment is electrically connected to another one of the plurality of second connection terminals.

10. The light-emission driving substrate according to claim 1, wherein the plurality of first connection terminals and the second connection terminals are respectively arranged in a same direction at intervals;
in the direction for arrangement of the plurality of first connection terminals and the second connection terminals, a sum of lengths of the plurality of first connection terminals is A, and a sum of lengths of the second connection terminals is B, wherein A≥B.

11. The light-emission driving substrate according to claim 1, wherein the plurality of first connection terminals and the second connection terminals are arranged as a whole in rows and columns, and for a same row of plurality of first connection terminals and second connection terminals, a distance between at least one of the plurality of first connection terminals and the binding area is smaller than a distance between each of the second connection terminals and the binding area.

12. The light-emission driving substrate according to claim 1, wherein a sum of orthographic projection areas of the plurality of first connection terminals on the substrate is C, and a sum of orthographic projection areas of the second connection terminals on the substrate is D, wherein C≥D.

13. The light-emission driving substrate according to claim 1, wherein the number of the plurality of first connection terminals is greater than the number of the second connection terminals.

14. The light-emission driving substrate according to claim 1, wherein the device layer further comprises a plurality of bridging lines in the light-emitting area, and wherein each of the plurality of first signal lines is electrically connected through at least one of the plurality of bridging lines and each of the plurality of second signal lines is electrically connected through at least one of the plurality of bridging lines.

15. The light-emission driving substrate according to claim 14, wherein each of the plurality of bridging lines is a straight line segment, and the plurality of bridging lines are spaced apart from each other and have line-widths that are increasing along a direction away from the binding area.

16. The light-emission driving substrate according to claim 14, wherein the plurality of first signal lines and the second signal lines are respectively disposed in a different layer from the plurality of bridging lines, and each of the plurality of bridging lines is electrically connected to a corresponding first signal line or a corresponding second signal line through a via.

17. The light-emission driving substrate according to claim 16, wherein the number of orthographic projections of the vias covered by orthographic projections of the plurality of bridging lines on the substrate increases along a direction away from the binding area.

18. The light-emission driving substrate according to claim 14, wherein the device layer comprises a plurality of metal layers that are stacked in layers and insulating layers each of which is disposed between two adjacent metal layers, the plurality of first signal lines, the second signal lines, the plurality of first connection terminals, the second connection terminals and the plurality of bridging lines are formed in the plurality of metal layers, and the plurality of first connection terminals are disposed in a same layer as the plurality of first signal lines, the second connection terminals are disposed in a same layer as the second signal lines, and the plurality of bridging lines are disposed in a different layer from the plurality of first signal lines and the second signal lines.

19. A light-emitting panel, comprising:
the light-emission driving substrate according to any claim 1; and
a light-emitting layer stacked on a side of the device layer away from the substrate and disposed in the light-emitting area, wherein the light-emitting layer comprises the light-emitting elements that are disposed in an array, the anode of the light-emitting element is electrically connected to the plurality of first signal lines and the cathode of the light-emitting element is electrically connected to the second signal lines.

20. A display device, comprising:
the light-emitting panel according to claim 19; and
the driving chip connected to the binding area.

* * * * *